United States Patent
Elmer et al.

(10) Patent No.: US 9,105,448 B2
(45) Date of Patent: *Aug. 11, 2015

(54) ELECTRON BEAM DIAGNOSTIC SYSTEM USING COMPUTED TOMOGRAPHY AND AN ANNULAR SENSOR

(71) Applicant: Lawrence Livermore National Security, LLC, Livewrmore, CA (US)

(72) Inventors: John W. Elmer, Danville, CA (US); Alan T. Teruya, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/305,905

(22) Filed: Jun. 16, 2014

(65) Prior Publication Data
US 2015/0001416 A1    Jan. 1, 2015

Related U.S. Application Data

(63) Continuation of application No. 12/917,028, filed on Nov. 1, 2010, now Pat. No. 8,791,426.

(60) Provisional application No. 61/264,187, filed on Nov. 24, 2009.

(51) Int. Cl.
*H01J 37/244* (2006.01)
*G01T 1/29* (2006.01)
*H01J 37/315* (2006.01)

(52) U.S. Cl.
CPC .............. *H01J 37/244* (2013.01); *G01T 1/2914* (2013.01); *H01J 37/315* (2013.01); *H01J 2237/24405* (2013.01); *H01J 2237/24542* (2013.01); *H01J 2237/28* (2013.01); *H01J 2237/30472* (2013.01)

(58) Field of Classification Search
CPC .............. H01J 37/244; H01J 2237/244; H01J 2237/24405; H01J 2237/24542
USPC ................................. 250/397; 324/71.3, 71.4
See application file for complete search history.

(56) References Cited

U.S. PATENT DOCUMENTS

| 4,158,122 | A | * | 6/1979 | Podola et al. ............ 219/121.26 |
| 4,897,545 | A | | 1/1990 | Danilatos |
| 4,939,371 | A | | 7/1990 | Goto |
| 5,483,036 | A | * | 1/1996 | Giedt et al. ............... 219/121.14 |
| 5,644,132 | A | | 7/1997 | Litman et al. |
| 6,300,755 | B1 | | 10/2001 | Elmer et al. |
| 6,977,382 | B2 | | 12/2005 | Lower |

(Continued)

FOREIGN PATENT DOCUMENTS

WO    2013173322    11/2013

*Primary Examiner* — Jack Berman
(74) *Attorney, Agent, or Firm* — Eddie E. Scott

(57) ABSTRACT

A system for analyzing an electron beam including a circular electron beam diagnostic sensor adapted to receive the electron beam, the circular electron beam diagnostic sensor having a central axis; an annular sensor structure operatively connected to the circular electron beam diagnostic sensor, wherein the sensor structure receives the electron beam; a system for sweeping the electron beam radially outward from the central axis of the circular electron beam diagnostic sensor to the annular sensor structure wherein the electron beam is intercepted by the annular sensor structure; and a device for measuring the electron beam that is intercepted by the annular sensor structure.

15 Claims, 10 Drawing Sheets

(56) References Cited

U.S. PATENT DOCUMENTS

| | | |
|---|---|---|
| 7,244,950 B2 | 7/2007 | Elmer et al. |
| 8,530,851 B2 | 9/2013 | Abgaryan et al. |
| 8,791,426 B2 * | 7/2014 | Elmer et al. .................. 250/397 |
| 2006/0196853 A1 | 9/2006 | Elmer et al. |
| 2008/0088295 A1 | 4/2008 | Teruya et al. |
| 2013/0299700 A1 | 11/2013 | McAninch et al. |

* cited by examiner

ELECTRON BEAM DIAGNOSTIC SYSTEM USING COMPUTED TOMOGRAPHY AND AN ANNULAR SENSOR

CROSS-REFERENCE TO RELATED APPLICATIONS

The present application is Continuation of application No. 12/917,028 filed Nov. 1, 2010, which claims benefit under 35 U.S.C. §119(e) of U.S. Provisional Patent Application No. 61/264,187 filed Nov. 24, 2009, the disclosure of which is hereby incorporated by reference in its entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

1. Field of Endeavor

The present invention relates to analyzing electron beams and more particularly to an annular sensor for analyzing electron beams.

2. State of Technology

U.S. Pat. No. 6,300,755 issued Oct. 9, 2001 to John W. Elmer and Alan T. Teruya for an enhanced modified Faraday cup for determination of power density distribution of electrons relates to the measurement of the current density distribution in electron and ion beams, particularly to a modified Faraday cup having radial slits therein to create an image of the current density of such beams, and more particularly to an enhanced modified Faraday cup utilizing two spaced slit disks, one disk having one slit wider than the other slits, and a ring to help minimize the amount of secondary electrons and ions from being produced. U.S. Pat. No. 6,300,755 provides the following state of technology information:

> The present invention Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact the many welds are made over a period of time and with different welding operators. Further complications arise when welds are developed on one machine than transferred to a different machine for production. An electron beam diagnostic method has been developed that enables the precise characterization of the power density distribution in high power electron beams. Such diagnostic method, which utilizes a modified Faraday cup, is exemplified by U.S. Pat. Nos. 5,382,895, 5,468,966, 5,554,926 and U.S. Pat. No. 5,583,427. This electron beam diagnostic method has been utilized, for example, to certify changes in electron beam welders, and is further described in J. W. Elmer et al, "Tomographic Imaging of Non-Circular and irregular Electron Beam Power Density Distributions," Welding Journal 72 (ii), p. 493-s, 1993; A. T. Teruya et al, "A System for the Tomographic Determination of the Power Distribution in Electron Beams", The Laser and Electron Beam in Welding, Cutting, and Surface Treatment State-of-the-Art 1991, Bakish Materials Corp., p. 125, 1991; and J. W. Elmer et al, "Beam Profile Analysis for the C&MS B231 Electron Beam Welding Machines", LLNL UCRL-ID-127549, Jun. 12, 1997.

The present invention provides an enhancement of the modified Faraday cup (MFC) diagnostic device utilized in the above-referenced patents, and specifically provides an improvement over the MFC of above-referenced U.S. Pat. No. 5,583,427. The enhanced MFC of the present invention improves the quality of the signal that is measured by the MFC, and thus improves the accuracy of the power density distribution measurements. In the MFC of U.S. Pat. No. 5,583,427, the electron beam is oscillated around a tungsten slit disk which samples the beam. The sampled beam current is then measured with an MFC. The MFC of the patent suffers from two problems. First, a substantial percentage of the electron current passing into the Faraday cup could be transported as secondary electrons and/or ions back up to the tungsten slit disk, and therefore would not be properly accounted for. Second, with repeated use, the electrical contact between the tungsten slit disk and the copper heat sink body would degrade. Also, when measuring non-circular beams with the prior MFC, there was no method to orient the measured beam profile with respect to the welding chamber.

The present invention overcomes the above-mentioned electron capture problems by the inclusion of several significant additions to the MFC, of which includes a second slit disk located inside the Faraday cup, a ring added in the Faraday cup below the second slit disk, a beam trap added within the Faraday cup, an improved ground arrangement for the tungsten slit disk, and modifying the tungsten slit disk to orient the beam profile with respect to the welding chamber.

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives failing within the spirit and scope of the invention as defined by the claims.

The present invention provides a new concept for analyzing electron beams that uses an annular sensor rather than the multiple radial slit sensor (For example, the 17 radial slit prior art sensor) used in previously electron beam diagnostic systems. The annular sensor changes the geometry by which the electron beam is scanned over the sensor and has key advantages over the previously invented enhanced modified Faraday cup designs. These advantages include: 1) The annular sensor has no limitations on how many different electron beam profiles can be taken, which increases the resolution of the computer tomographically reconstructed electron beam profile, 2) the annular sensor allows the beam to be swept in a linear fashion rather than in a circular fashion across the sensor which is easier for many machines perform, 3) the beam can be analyzed without having to be swept as far away from the central location, which makes the diagnostic smaller and easier to use on most electron beam machines, and 4) the design can easily be incorporated with a detached heat sink which makes it simpler and easier to manufacture, particularly when used for higher power applications.

An annular electron beam diagnostic sensor designed in a number of ways, but all embodiments rely on a circular shaped sensor, that can be continuous or segmented, and is arranged coaxially with the propagation axis of the electron beam. The basic principal is to sweep the electron beam over the sensor at a known speed using the standard magnetic deflection coils that are present on all electron beam welders, and on other electron beam devices such as scanning electron microscopes. As the beam crosses the sensor, the beam's current is intercepted, generating a current versus time profile of the electron distribution in the beam. The current in this signal is then measured, using a fast acting data acquisition system, to render a current versus position of the electron beam that is integrated along the length of the portion of the sensor that is intercepting the beam.

By making the with of the annular sensor small relative to the size of the beam, and sampling the data rapidly, an accurate measurement of the beam's profile can be made. This process is repeated by scanning the beam at different angles over the sensor while keeping the beam scan direction normal to the tangent of the annular sensor. Each angle gives a different view of the beams profile which can be analyzed using CT methods to recreate the power density distribution in the beam.

The present invention has use in electron beam welding, electron beam gun design, focusing of high power electron beams, quality control of electron beams, high resolution profiling of electron beams, transferring electron beam parameters between machines and facilities.

The invention is susceptible to modifications and alternative forms. Specific embodiments are shown by way of example. It is to be understood that the invention is not limited to the particular forms disclosed. The invention covers all modifications, equivalents, and alternatives failing within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF SPECIFIC EMBODIMENTS

Figure 1:
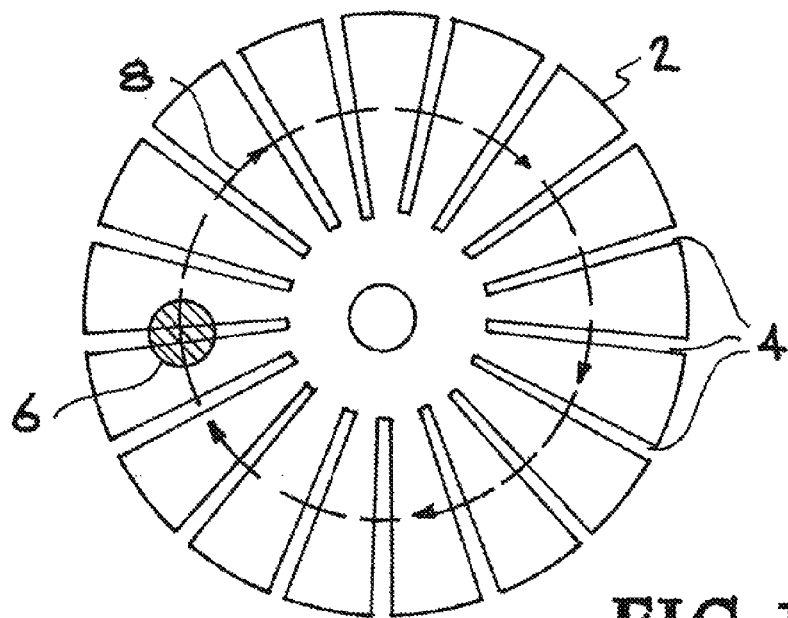
FIG. 1 provides an illustration of a prior art system for analyzing electron beams to serve as background for the description of the present invention.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives failing within the spirit and scope of the invention as defined by the claims.

Electron beam diagnostics have been developed by the Applicants for measuring the power density of beams used for welding and other applications. The fundamental concept behind the recent diagnostic devices is based on the enhanced modified Faraday cup (EMFC) design. The EMFC design uses a circular disk with multiple radially oriented slits to sample the electron beam at different angles as the beam is rotated in a circular path over the disk. The data acquired from the EMFC diagnostic is further analyzed using computed tomography (CT) to render a power density distribution of the electron beam. This data can be used for focusing the beam, transferring electron beam parameters between machines and facilities, and quality control. The EMFC diagnostic has been used successfully at a number of institutions to measure beams up to 8 kW in power. Higher power concepts of the diagnostic have been patented based on the multiple slit design, but not yet manufactured. All low power, high power, and micro versions of the EMFC rely on the radial slit design, which has some limitations in that the resolution of the reconstructed beam is restricted by having a fixed number of profiles (typically 17) of the beam. In addition, the design is one that is complicated to modify in order to handle higher power electron beams, which in some commercial applications, may be as high as 100 kW, and there is a requirement to circle the beam in a large diameter circle (25 mm) over the slits to provide adequate separation between the slits to measure defocused beams.

Referring now to the drawings and in particular to FIG. 1, information about the prior art system is provided to serve as background for the description of the present invention. FIG. 1 is an illustration of the prior art system that includes a refractory metal disc 2 with a series of slits 4. The number of slits shown is 17. The number of slits is restricted by the allowable spacing of the slits. An electron or ion beam 6 travels in circular path 8 around the disc 2 and as the beam 6 crosses the slits 4 a signal is generated. This signal goes to a data acquisition system where an image of the current density in high or low power ion or electron beams is created. The number of data points taken is limited to the spacing of the slots.

The present invention provides a new concept for analyzing an electron beam. This new concept uses an annular slit as the sensor rather than the disc with slits as illustrated in the prior art. The annular sensor changes the geometry by which the electron beam is scanned over the sensor and has several key advantages over the prior art design. The annular sensor has no limitations on how many different electron beam profiles can be taken, which increases the resolution of the tomographically reconstructed electron beam profile. The annular sensor allows the beam to be swept in a linear fashion (illustrated and described in FIG. 7) rather than the circular fashion across the sensor this being easier for many machines to perform. The beam can be analyzed without having to be swept as far from the beams central location, which makes the diagnostic smaller and easier to use on most electron beam machines. This design can easily be incorporated with a detached heat sink which will be simpler and easier to manufacture, particularly when used for high power applications.

The present invention provides a new concept for analyzing electron beams that uses an annular sensor rather than the multiple radial slit sensor used in the EMFC. The advantages of the annular sensor are: 1) it has no limitations on how many different electron beam profiles can be taken, which increases the resolution of the CT reconstructed electron beam profile, 2) the annular sensor allows the beam to be swept in a linear fashion rather than in a circular fashion across the sensor which is easier for many machines perform, 3) the beam can be analyzed without having to be swept as far away from the central location, which makes the diagnostic smaller and easier to use on most electron beam machines, and 4) the design can easily be incorporated with a detached heat sink which makes it simpler and easier to manufacture, particularly when used in higher power applications. The annular sensor will acquire beam profile data very similar to that acquired by the EMFC, allowing existing CT software and methods to be used reconstruct and analyze the acquired data as done with the EMFC.

The annular electron beam diagnostic sensor can be designed in a number of ways, but all embodiments rely on a circular shaped sensor, that can be continuous or segmented, and is arranged coaxially with the propagation axis of the electron beam. The basic principal is to sweep the electron beam over the sensor at a known speed using the standard magnetic deflection coils that are present on all electron beam welders, and on other electron beam devices such as scanning electron microscopes. As the beam crosses the sensor, the beams current is intercepted, generating a current versus time profile of the electron distribution in the beam. The current in this signal is then measured, using a fast acting data acquisition system, to render a current versus position of the electron beam that is integrated along the length of the portion of the sensor that is intercepting the beam. By making the width of the annular sensor small relative to the size of the beam, and sampling the data rapidly, an accurate measurement of the beam's profile can be made. This process is repeated by scanning the beam at different angles over the sensor while keeping the beam scan direction normal to the tangent of the annular sensor. Each angle gives a different view of the beam's profile which can be analyzed using CT methods to recreate the power density distribution in the beam, much the same as has previously done using the EMFC reconstruction method.

Figure 2:
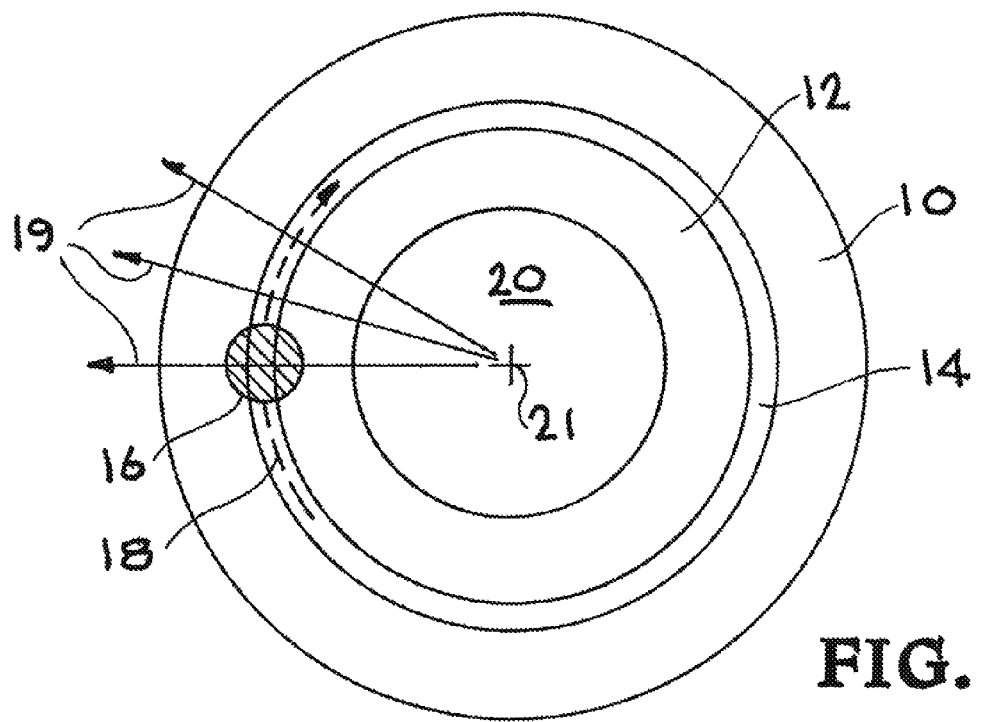
FIG. 2 is a simplified conceptual drawing of the present invention.

Referring now to FIG. 2, a simplified conceptual drawing of the present invention provided. Shown in FIG. 2 is a continuous slit or sensor 14 that is separated by an outer ring 10 and an inner ring 12. Also show is a central opening 20. There is an electron beam 16 centered at 20. The motion of the electron beam 16 will be shown and described in greater detail in connection with the description of FIG. 7.

Figure 3:
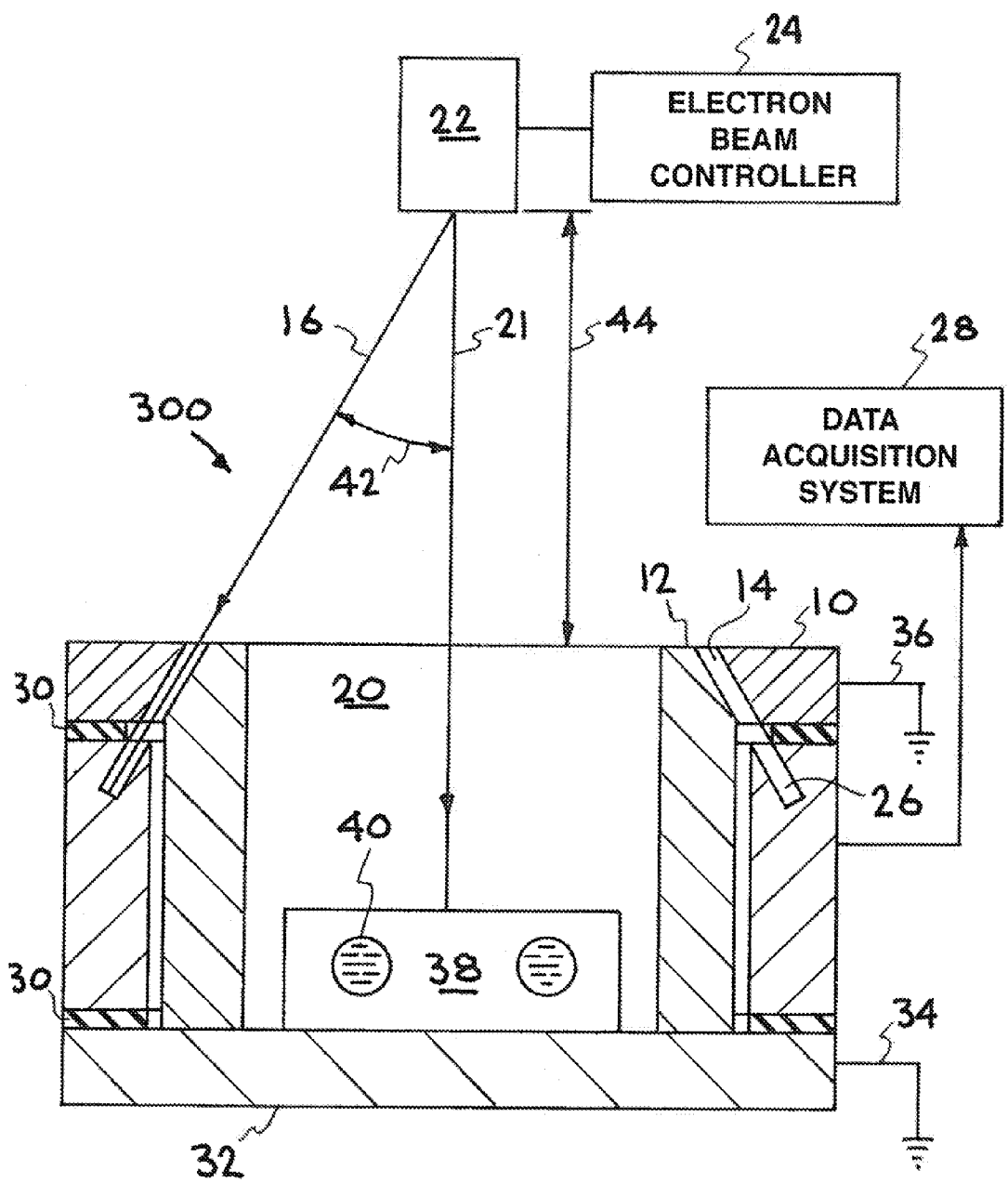
FIG. 3 illustrates one embodiment of the present invention using slotted Faraday cup technology.

One embodiment of the present invention is illustrated in FIG. 3. The embodiment illustrated in FIG. 3 is designated generally by the reference numeral 300. The embodiment 300 has an annular slit which the beam passes through as it is scanned over the slit. The slit is made between two high temperature refractory metals such as tungsten, and the portion of the beam passing through the slit is intercepted by a Faraday cup arrangement below the slit. The acquired signal is processed through the data acquisition system in the same way as for the solid conductor sensor. The advantage of an annular slit is that it can be designed to handle higher power densities without having to worry about melting the thin conducting wire of the first arrangement shown in FIG. 3. The disadvantages are that the slit-type may be more complicated to design and manufacture than the solid conductor, since it requires the use of a Faraday cup arrangement below the slit, similar to that used in the EMFC.

FIG. 3 provides a cross sectional view of the electron beam diagnostic annular sensor system 300. There is a base plate 32 upon which are mounted the inner ring 12, outer ring 10 and the Faraday cup unit 26. Electrical isolation 30 electrically isolates the Faraday cup unit from the other items. The Faraday cup 26 is where the signal or data is generated and is connected to the data acquisition system 28. The inner ring 12 and outer ring 10 are separately grounded at 34 and 36. There is an electron beam source 22 connected to an electron beam controller 24. The electron beam centerline is 20. The angle of the slot 14 will be governed by the distance 44 of the electron beam source 22 from the top surface of the unit 300 and the sweep angle 42. Located within the central opening 20 is a beam dump 38, cooling passages 40 may be added for higher powered applications.

Figure 4:
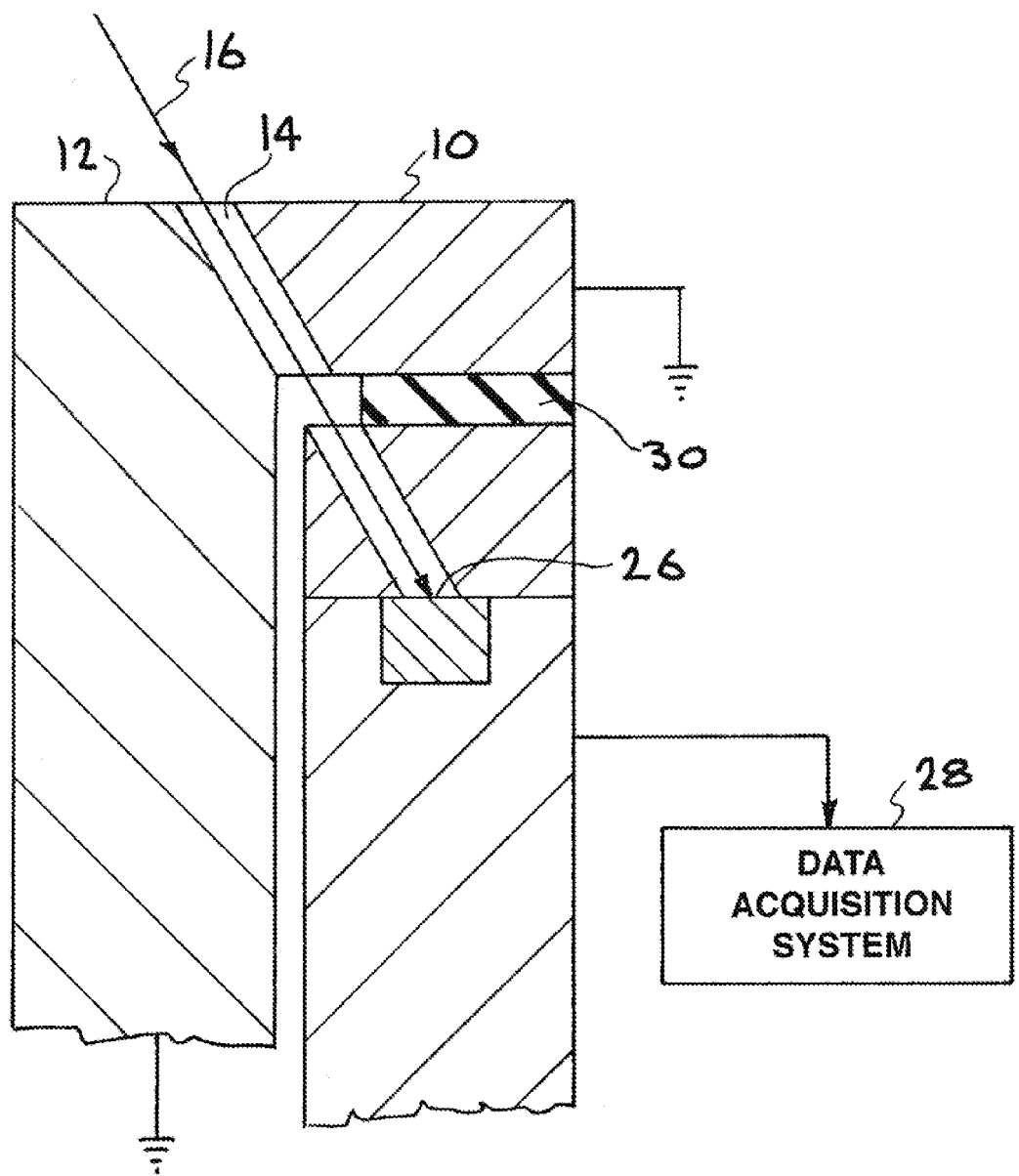
FIG. 4 illustrates an enlarged partial of the inner and outer rings and the slot.

Referring now to FIG. 4 an enlarged partial of the inner and outer rings and the slot is illustrated. Some materials that could be used are tungsten for the inner and outer rings 12 and 10 while the material surrounding the Faraday cup area might be copper.

Figure 5:
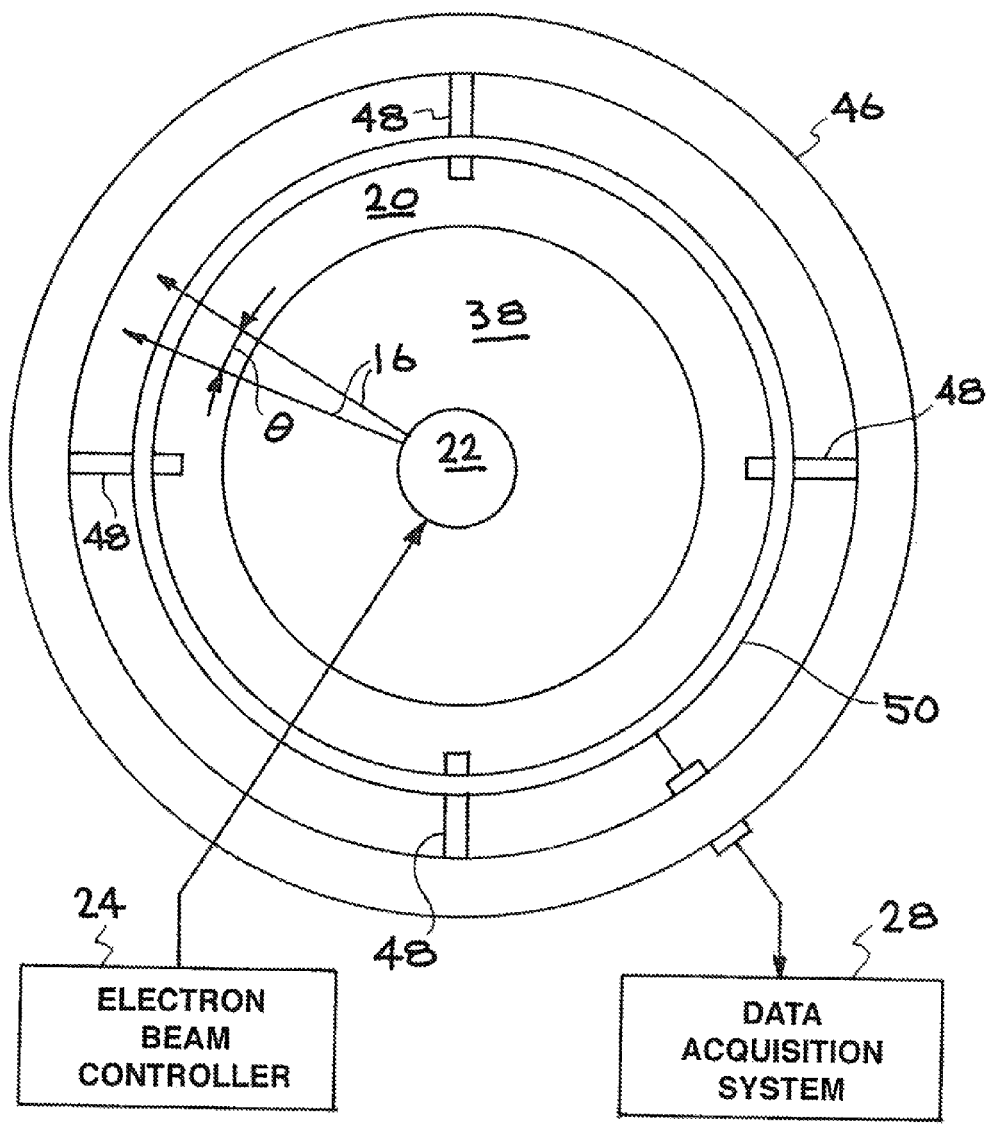
FIG. 5 illustrates another embodiment of an electron beam diagnostic system using a solid wire technique.

FIG. 5 illustrates another embodiment of an electron beam diagnostic system using an annular technique. Here the sensor is illustrated as a solid conducting wire concentrically surrounding the center of propagation of the electron beam. As the beam crosses the sensor, a fast acting data acquisition system gathers beam current versus time data for the portion of the beam intercepted by the thin sensor conductor. As the beam returns to its center position, a second profile from the same angular location is recorded. The beam is then scanned at a new angle, offset by θ deg, and the process is repeated. Since the sensor is continuous, θ, can be made as small as desired, thus allowing the diagnostic to gather as many angles as needed for the desired resolution of the reconstructed beam.

FIG. 5 shows a housing 46 that surrounds the annular sensor 50. In this case the annular sensor 50 is a wire. The annular sensor 50 is shown supported in four places by non-electrical conducting support pins 48 that protrude from the inner wall of housing 46. The sensor 50 is shown connected to the data acquisition system 28. There is a central opening 20 in which a beam dump 38 is located. Also shown are the beam source 22 connected to the electron beam controller 24. Two sweeps of the beam 16 are shown the two sweeps are separated by some angle theta. The angle theta is controlled by the electron beam controller 28.

Figure 6:
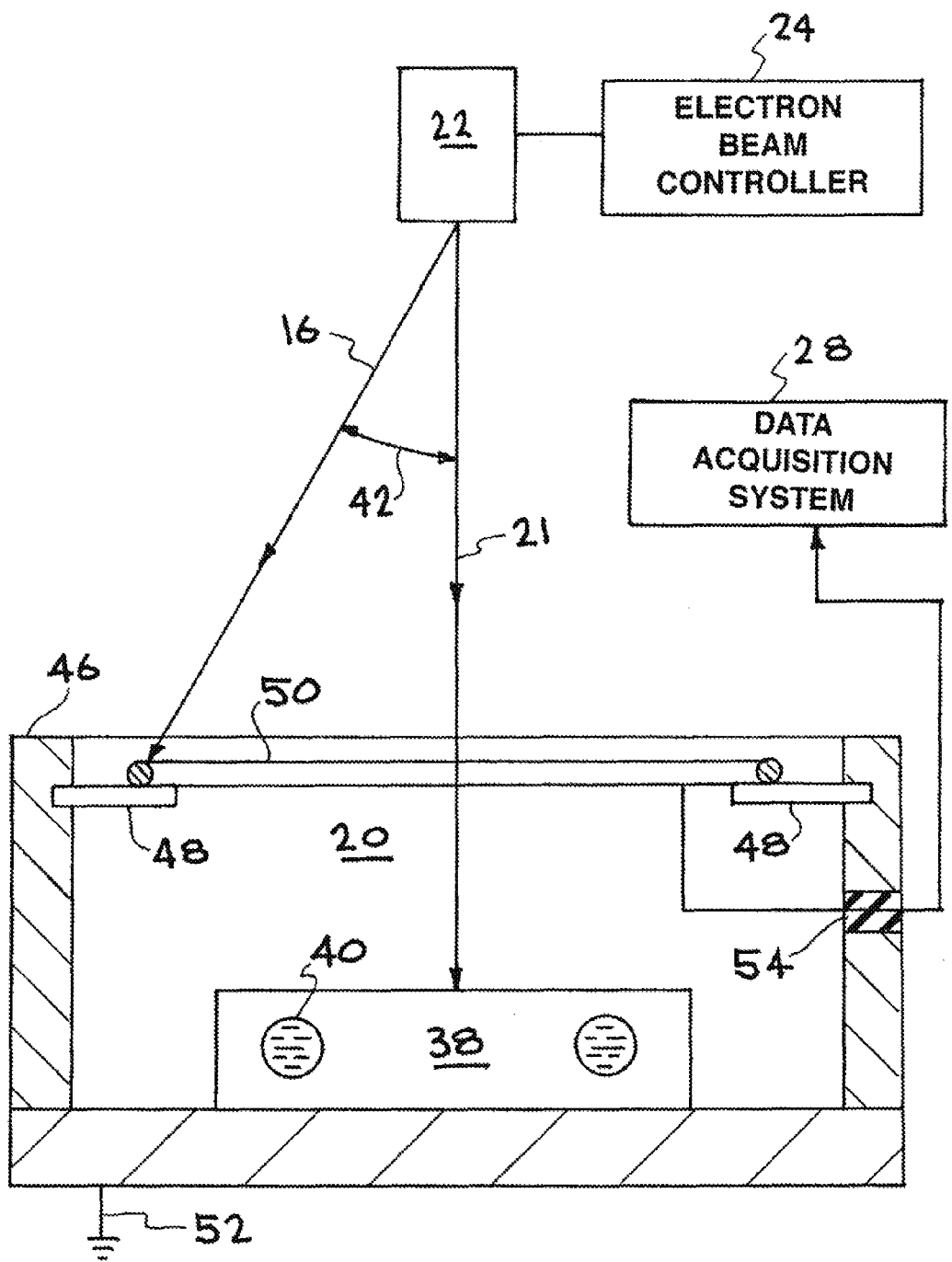
FIG. 6 is a cross sectional view of the system of FIG. 5.

FIG. 6 is a cross sectional view of the system of FIG. 5. Here we see the housing 46 and the non-conducting support pins 48 supporting the annular sensor 50. The annular sensor 50 is shown connected to the data acquisition system 28. Where the connection passes through the wall of housing 46 where electrical isolation 54 has been provided. Again a beam center line 20 is shown and a beam sweep angle 42 the sweep angle controlled by the electron beam controller 24. A beam dump 38 is shown located in the central opening 20 and cooling passages 40 can be incorporated for high energy applications. Housing 46 is grounded at 52.

Figure 7:
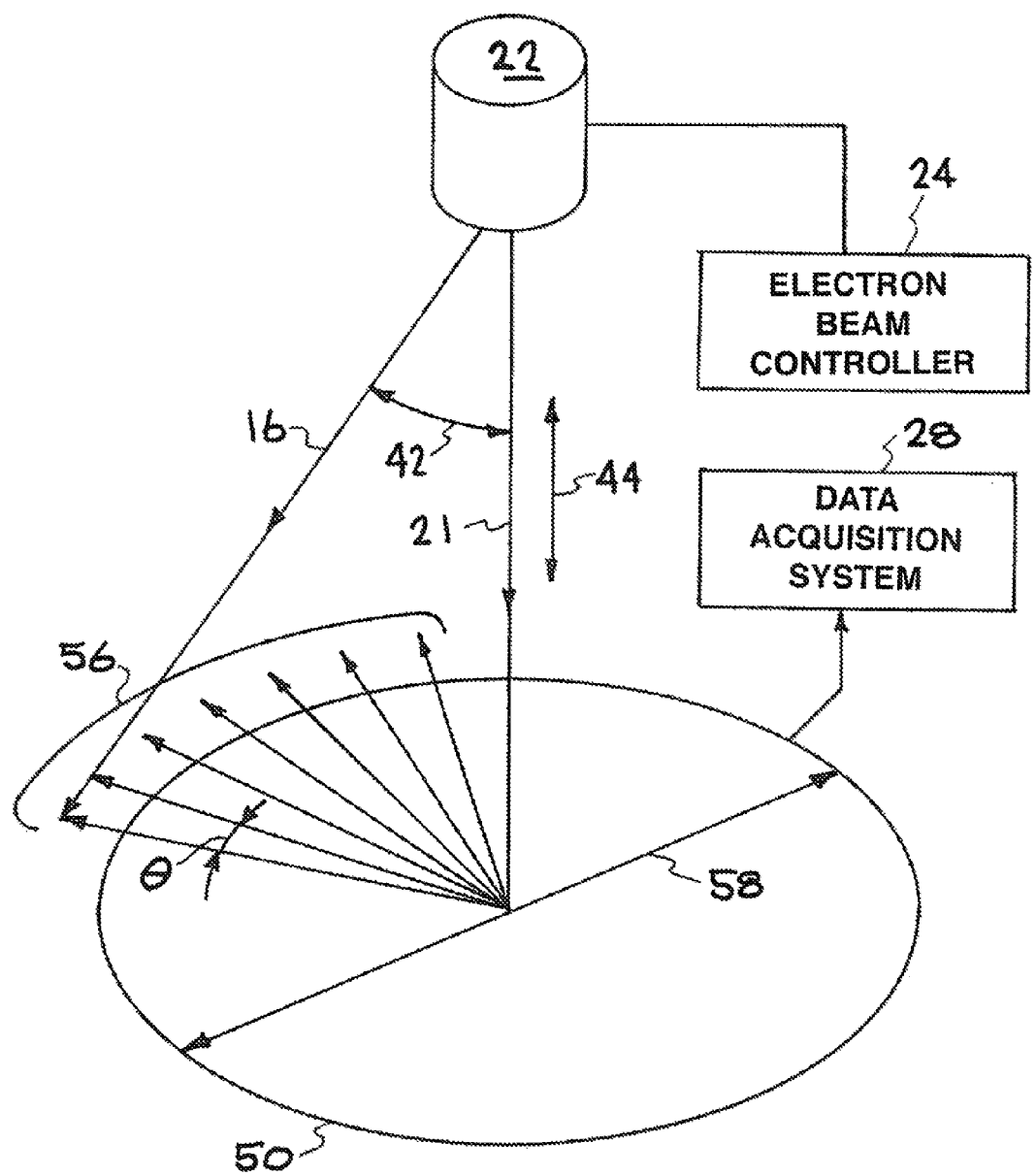
FIG. 7 is a diagram illustrates the various factors that are used by the beam controller to generate a computer tomographically constructed beam profile.

FIG. 7 illustrates the various factors that are used by the beam controller to generate a computer tomographically constructed beam profile. The annular sensor 50 with some unspecified diameter 58 is shown connected to the data acquisition system 28. The doubled headed arrow 44 is the distance of the electron beam source 22 from the top surface of the annular sensor 50. The sweep angle is 42 and a number of sweeps 56 are shown. The angle between the sweeps is represented by Theta. The electron beam controller can make use of all these factors to compile a very accurate beam profile.

Another concept for the annular sensor of the present invention uses a segmented slit as illustrated in FIGS. 8A-8D. In this version, the annular sensor is segmented and arranged in two circular paths with different diameters. The slits are machined into a high melting point material such as tungsten, allowing the annular sensor to be fabricated from one piece of material. The two sets of concentric annular segments are offset so that the gaps between the segments do not line up, which insures that as the beam is scanned over the slits there will always be at least one perfect beam profile that is collected. In terms of fabrication this design can be manufactured very much the same as previous versions of the EMFC diagnostic. This design adapted to be a drop-in replacement for the multiple slit diagnostic used in the EMFC.

Figure 8A:
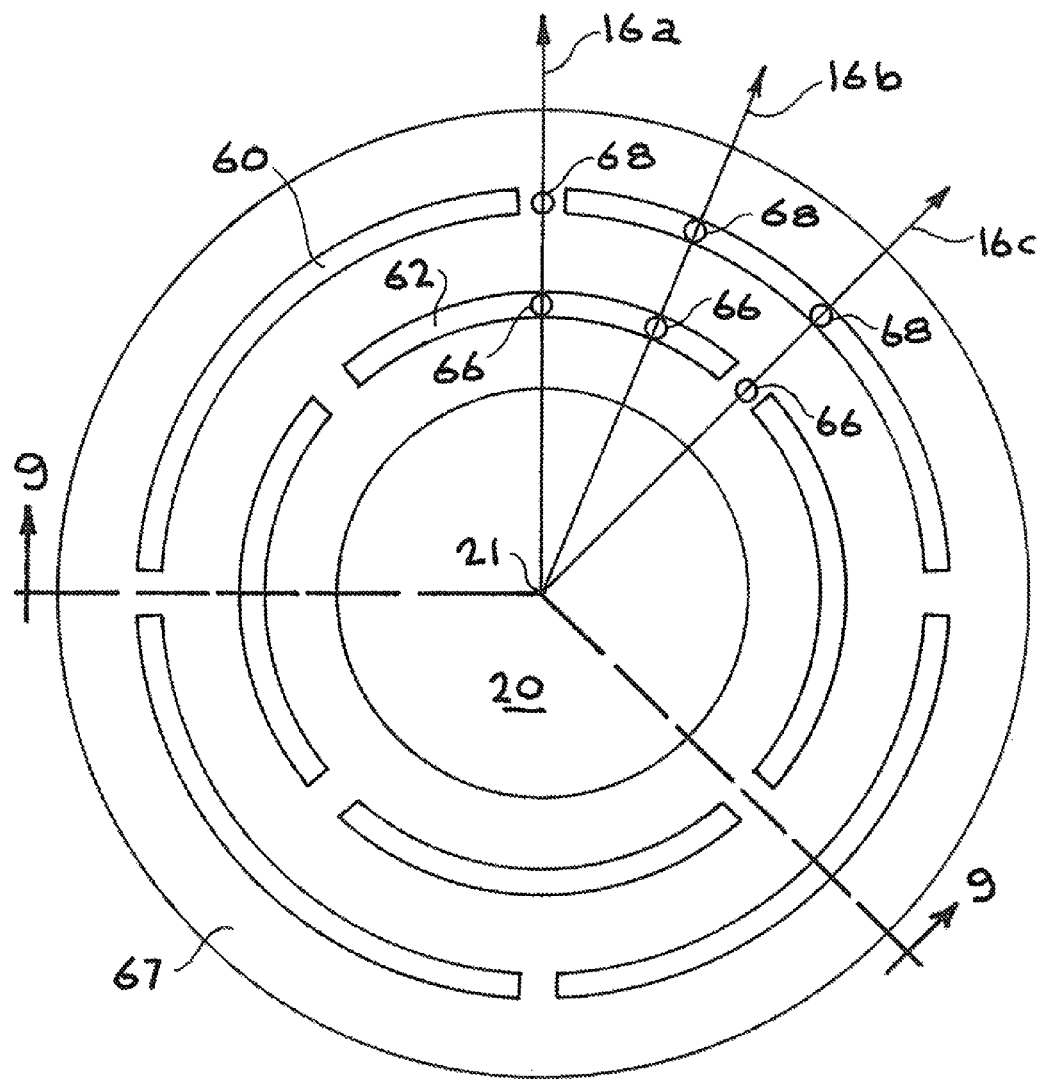
FIGS. 8A-8D illustrates additional embodiments of the present invention.
Figure 8B:
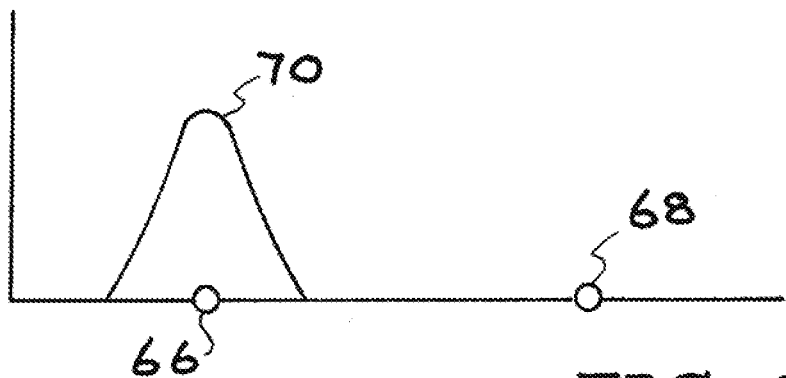
Figure 8C:
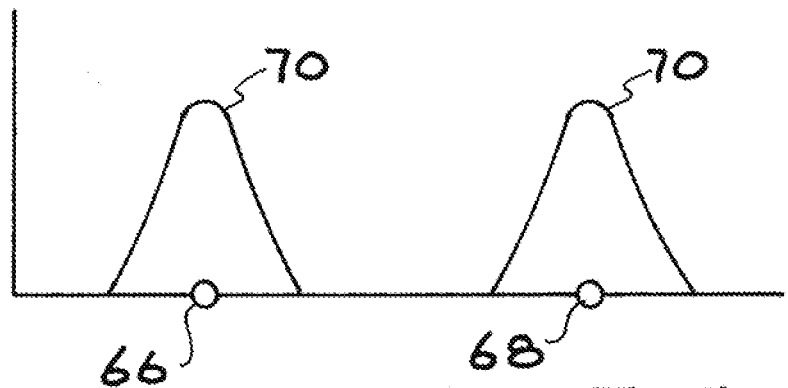
Figure 8D:
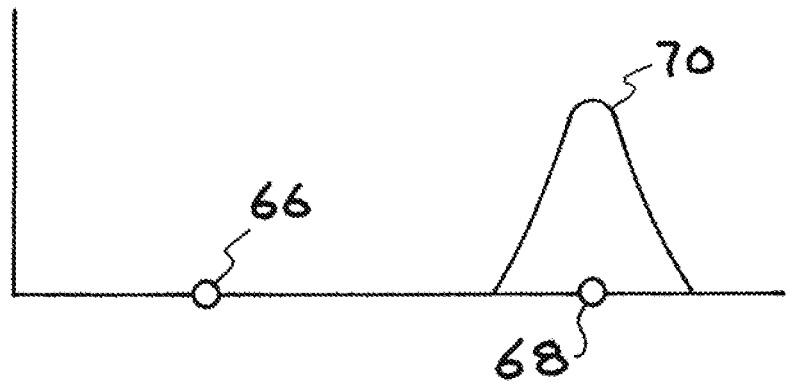

Referring now to FIG. 8A a concept of the annular sensor is illustrated. In this design two concentric segmented annular slits are provided. The slits are machined into a high melting pout material such as tungsten, allowing the annular sensor to be fabricated from one piece of material. The two sets of concentric annular segments are offset so that the gaps between the segments do not line up, which insures that as the beam is scanned over the slits there will always be data collected.

FIG. 8A shows a one piece sensor body 67 with the two concentric segmented slits, the outer slit is labeled 60 and the inner slit is labeled 62. A central opening 20 is also shown. Three beam line scans 16 are shown and labeled 16a, 16b and 16c. The scan 16a is shown crossing the inner slit 62 at the node 66 where data 70 is generated and crossing the outer slit 60 in the gap area at node 68 where no data 70 is generated, this is shown on the graph of FIG. 8B. Scan 16b is shown crossing both the inner slit 62 and outer slit 60 generating data 70 at both nodes 66 and 68, this is shown on the graph of FIG. 8C. The third scan 16c is shown crossing the inner slit 62 in the gap are at node 66 and crossing the outer slit at node 68 where data 70 is generated and this is shown on the graph of FIG. 8D.

Figure 9:
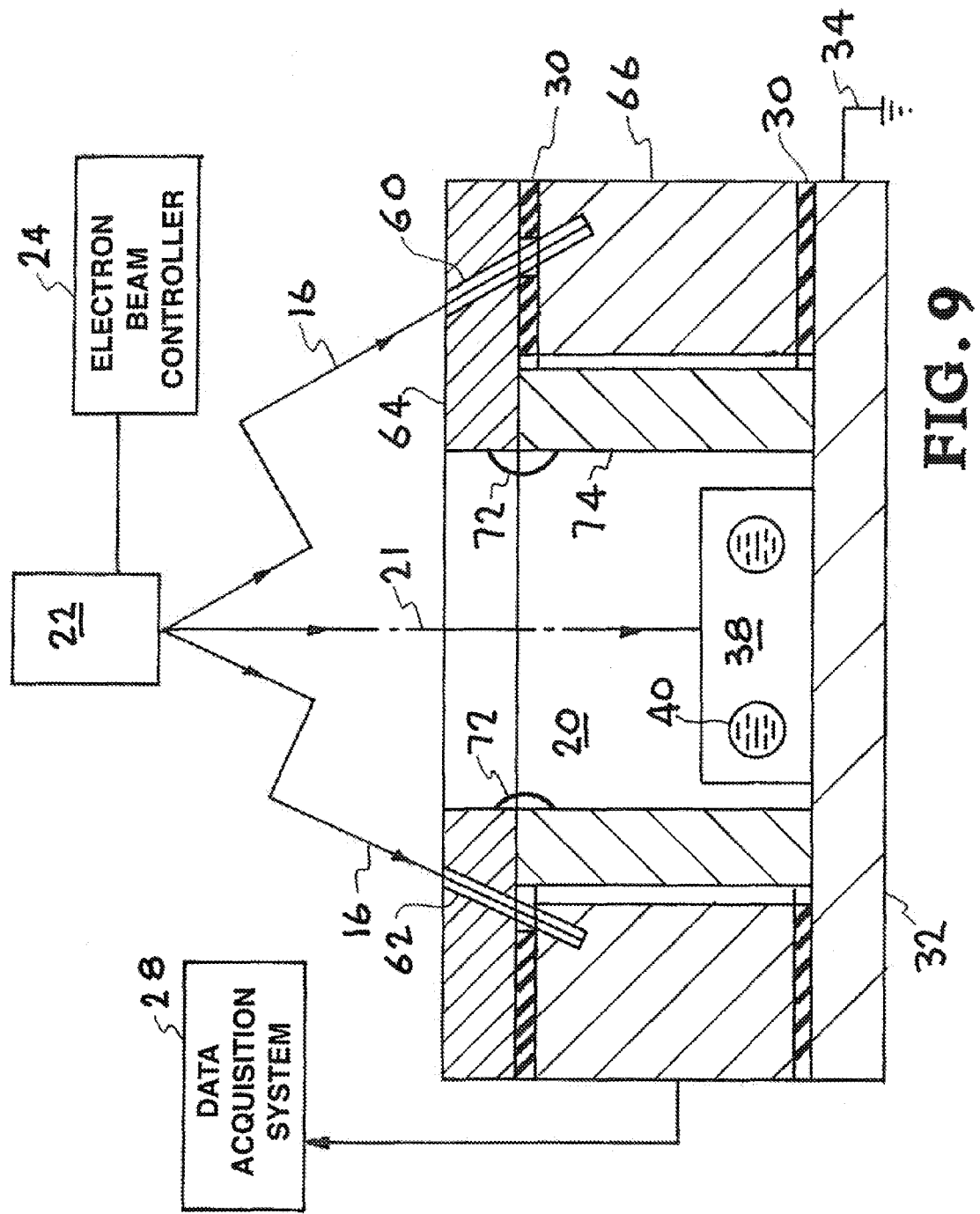
FIG. 9 illustrates additional details of the annular sensor that uses a segmented slit illustrated in FIGS. 8A-8D.

Referring now to FIG. 9, additional details are provided of the annular sensor that uses a segmented slit illustrated in FIGS. 8A-8D. FIG. 9 is a sectional view of the segmented slit design taken on the cutting plane 9-9 of FIG. 8A. Shown here is a top plate 64 that is connected to a ring piece 74 that in turn is connected to a base plate 32, these items 64, 74 and 32 are in electrical contact and are grounded at 34, grounding straps 72 can be added to insure electrical conductivity between top plate 64 and ring 74. The inner slit 62 and outer slit 60 are shown extending into the sensor body 66. The sensor body 66 is electrically isolated by the electrical insulators 30. The beam line 16 is shown distorted in order to also show the beam source 22 and beam controller 24. Data acquisition system 28 is also shown. A beam dump 38 with or without cooling passages 40 is shown in central opening 20. The central opening 20 can be extended through the base plate 32 and the beam dump can be located off the sensor which will lower the heat load on the sensor. This may be a desirable option in higher beam power applications.

Figure 10:
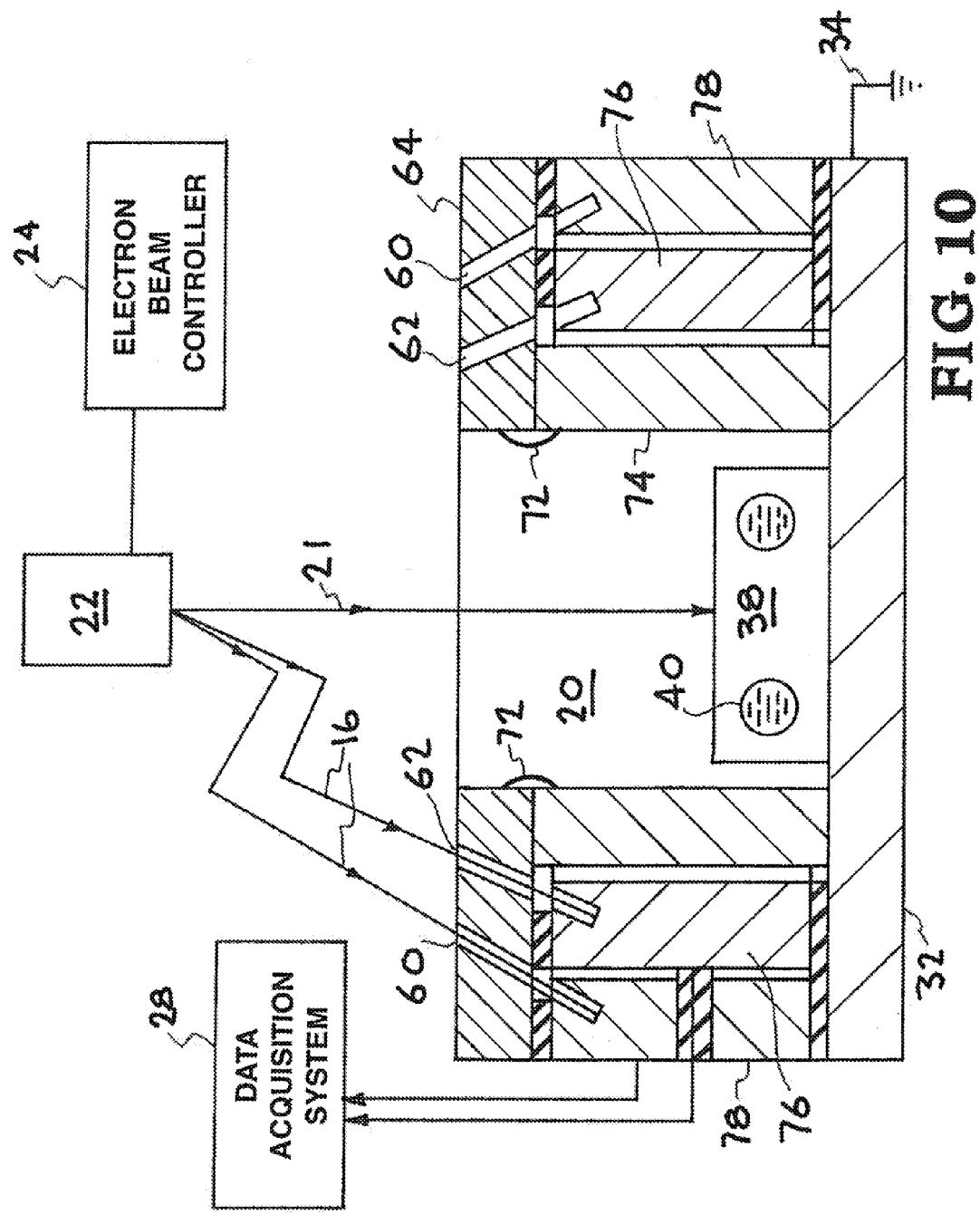
FIG. 10 illustrates additional details of another version of the annular sensor that used a segmented slit illustrated in FIGS. 8A-8D.

Referring now to FIG. 10, additional details are provided of another version of the annular sensor that uses a segmented slit illustrated in FIGS. 8A-8D. FIG. 10 is a concept very similar to the one shown in FIG. 9. The difference here is that the one piece sensor body 66 of FIG. 9 is now divided into two separate, electrically isolated sensor bodies 76 and 78. Separate data acquisition channels relieve the requirement that portions of a beam only travel through one slit at a time to avoid mixing of data. Thus the spacing between the inner slit 62 and the outer slit 60 may be reduced. All other items pertaining to the illustrated concept are the same as those shown on. FIG. 9.

Data Acquisition and Computed Tomography

The above concepts give examples of the basic operation principles for an annular sensor based on a solid conductor, a slit, and a segmented-slit type detector. Each design has certain advantages and disadvantages relative to each other, but all having the ability to provide much higher resolution of the reconstructed electron beam profile relative to the multiple radial slit sensor used in the EMFC. The basic data acquired from each type of sensor is identical, giving a profile of the beam current distribution which can later be reconstructed using computed tomography. From a CT reconstruction standpoint, the only difference between the annular sensor and the multiple radial slit detector is the orientation by which the beam crosses the slit. The annular sensor profiles the beam at an angle 90 deg from that of the radial slit detector, which can easily be accommodated by the existing CT reconstruction software. This allows the previously developed CT reconstruction software to be used for analysis of both the radial slit data and the annular slit data.

Diagnostic System Design

The basic principal of the diagnostic system is to acquire electron beam profiles as the beam is scanned across the sensor, and reconstruct this data into a power density distribution of the beam. The profiles consist of beam current versus time waveform, where the beam current is directly related to the number of electrons being intercepted by the detector over a given period of time defined by the sampling rate of the data acquisition system. Higher power density beams, or higher power density portions of a given beam, will produce higher currents in the sensor for a given period of time which produces a larger voltage drop across the known resistor in the data acquisition system. It is therefore important to collect as many electrons passing over the sensor as possible, and to not allow any of the other electrons in the beam that are outside the sensor to be collected.

There are different methods of doing this and for the slit-type sensor is a Faraday cup arrangement such as the one described in EMFC. The second aspect of the diagnostic system is to intercept all of the electrons not in the sensor region, isolate them, and transport them to a suitable electrical system ground. Since the electrons contain a high amount of kinetic energy, the heat dissipated from the electrons must also be transported away from the sensor in order to keep it from overheating. Many different possible arrangements can be developed for the annular sensor(s) to isolate the electrons in the sensor from the other electrons in the surrounding portions of the beam, and to transport both the beam current and heat generated from the beam safely away from the sensor.

For each of the annular sensor designs discussed above, the electron beams will be initiated in the center of the annular sensor, and will return to this location after each sweep of the beam. Therefore, the central portion of the detector will receive the majority of the electrons and heat and, because of this, must be connected to an electrically isolated heat sink.

Previous versions of the EMFC used a very efficient integral beam trap that doubled as a Faraday cup in the center of the detector to measure the total beam current. Low power versions consisted of copper and graphite elements to act as the heat sink, higher power versions required water cooling and other methods to prevent the detector from overheating. These same methods can be used for the annular sensor design. In addition, it is possible to separate the heat sink from the sensor, so that the majority of the beam's energy is decoupled from the sensor. This is even more important for the annular sensor design since the majority of the beams current will always be directed at the center of the diagnostic.

The annular electron beam diagnostic sensor can be designed in a number of ways, but all embodiments rely on a circular shaped sensor, that can be continuous or segmented, and is arranged coaxially with the propagation axis of the electron beam. The basic principal is to sweep the electron beam over the sensor at a known speed using the standard magnetic deflection coils that are present on all electron beam welders, and on other electron beam devices such as scanning electron microscopes. As the beam crosses the sensor, the beam's current is intercepted, generating a current versus time profile of the electron distribution in the beam. The current in this signal is then measured, using a fast acting data acquisition system, to render a current versus position of the electron beam that is integrated along the length of the portion of the sensor that is intercepting the beam. By making the width of the annular sensor small relative to the size of the beam, and sampling the data rapidly, an accurate measurement of the beam's profile can be made. This process is repeated by scanning the beam at different angles over the sensor while keeping the beam scan direction normal to the tangent of the annular sensor. Each angle gives a different view of the beam's profile which can be analyzed using CT methods to recreate the power density distribution in the beam, much the same as has previously done using the EMFC reconstruction method.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An apparatus for analyzing an electron beam, wherein the electron beam has a central propagation axis, comprising:
    an electron beam diagnostic sensor adapted to receive the electron beam;
    a continuous or segmented circular sensor structure operatively connected to said electron beam diagnostic sensor, wherein said continuous or segmented circular sensor structure has a sensor structure central axis that is arranged coaxially with the electron beam central propagation axis and wherein said continuous or segmented circular sensor structure receives the electron beam;
    a system for sweeping the electron beam from said sensor structure central axis and the electron beam central propagation axis to and along said continuous or segmented circular sensor structure wherein the electron beam is intercepted by said continuous or segmented circular sensor structure; and
    a device for measuring the electron beam that is intercepted by said continuous or segmented circular sensor structure.

2. The apparatus for analyzing an electron beam of claim 1 wherein said continuous or segmented circular sensor structure includes a slit.

3. The apparatus for analyzing an electron beam of claim 1 wherein said continuous or segmented circular sensor structure includes a continuous slit.

4. The apparatus for analyzing an electron beam of claim 1 wherein said continuous or segmented circular sensor structure is a segmented circular sensor structure.

5. The apparatus for analyzing an electron beam of claim 1 wherein said continuous or segmented circular sensor structure includes a wire.

6. The apparatus for analyzing an electron beam of claim 1 wherein said continuous or segmented circular sensor structure is a continuous circular sensor structure.

7. An apparatus for analyzing an electron beam, wherein the electron beam has a central propagation axis, comprising:
    an electron beam diagnostic sensor means for receiving the electron beam;
    a continuous or segmented circular sensor means for receiving the electron beam operatively connected to said electron beam diagnostic sensor means, wherein said continuous or segmented circular sensor means has a sensor means central axis arranged coaxially with the electron beam central propagation axis, and wherein said continuous or segmented circular sensor means receives the electron beam;
    means for sweeping the electron beam relative to said sensor means central axis and the electron beam central propagation axis to and along said continuous or segmented circular sensor means, wherein the electron beam is intercepted by said continuous or segmented circular sensor means, and
    means for measuring the electron beam that is intercepted by said continuous or segmented circular sensor means.

8. The apparatus for analyzing an electron beam of claim 7 wherein said continuous or segmented circular sensor means includes a slit.

9. The apparatus for analyzing an electron beam of claim 7 wherein said continuous or segmented circular sensor means includes a continuous slit.

10. The apparatus for analyzing an electron beam of claim 7 wherein said continuous or segmented circular sensor means is a segmented circular sensor means.

11. The apparatus for analyzing an electron beam of claim 7 wherein said continuous or segmented circular sensor means includes a wire.

12. The apparatus for analyzing an electron beam of claim 7 wherein said continuous or segmented circular sensor means is a continuous circular sensor means.

13. A method of analyzing an electron beam, wherein the electron beam has a central propagation axis, comprising the steps of:
    providing an electron beam diagnostic sensor adapted to receive the electron beam;
    providing a continuous or segmented circular sensor structure operatively connected to said electron beam diagnostic sensor, wherein said continuous or segmented circular sensor structure has a sensor structure central axis that is arranged coaxially with the electron beam central propagation axis and wherein said continuous or segmented circular sensor structure receives the electron beam;
    sweeping the electron beam radially outward from said central axis of said electron beam diagnostic sensor to said continuous or segmented circular sensor structure wherein the electron beam is intercepted by said continuous or segmented circular sensor structure;
sweeping the electron beam along said continuous or segmented circular sensor structure; and
measuring the electron beam.

14. The method of analyzing an electron beam of claim 13 wherein said continuous or segmented circular sensor structure that receives the electron beam renders a current versus position of the electron beam and wherein said step of measuring the electron beam generates a current versus time profile of the electron beam.

15. The method of analyzing an electron beam of claim 13 wherein said step of measuring the electron beam comprises using a fast acting data acquisition system to render a current versus position of the electron beam that is integrated along the length of the portion of the sensor that is intercepting the beam.

* * * * *